United States Patent
Li

(10) Patent No.: US 8,356,572 B2
(45) Date of Patent: *Jan. 22, 2013

(54) CLAMPING UNIT FOR DEPOSITING THIN FILM SOLAR CELL AND SIGNAL FEED-IN METHOD

(75) Inventor: Yi Li, Shenzhen (CN)

(73) Assignee: Shenzhen Trony Science & Technology Development Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/389,470

(22) PCT Filed: Oct. 21, 2010

(86) PCT No.: PCT/CN2010/001654
§ 371 (c)(1),
(2), (4) Date: Feb. 8, 2012

(87) PCT Pub. No.: WO2011/153670
PCT Pub. Date: Dec. 15, 2011

(65) Prior Publication Data
US 2012/0139416 A1 Jun. 7, 2012

(30) Foreign Application Priority Data
Jun. 11, 2010 (CN) .......................... 2010 1 0198736

(51) Int. Cl.
*H01J 1/52* (2006.01)
*B05C 13/00* (2006.01)
(52) U.S. Cl. .......................................... 118/500; 315/85
(58) Field of Classification Search .................... 315/85; 118/500
See application file for complete search history.

(56) References Cited

U.S. PATENT DOCUMENTS

| 4,723,508 | A | * | 2/1988 | Yamazaki et al. | 118/723 E |
|---|---|---|---|---|---|
| 5,538,610 | A | * | 7/1996 | Gesche et al. | 204/298.15 |
| 2012/0139416 | A1 | * | 6/2012 | Li | 315/85 |
| 2012/0142137 | A1 | * | 6/2012 | Hu et al. | 438/57 |
| 2012/0142138 | A1 | * | 6/2012 | Li | 438/57 |

FOREIGN PATENT DOCUMENTS

| CN | 101857953 A | * | 10/2010 |
|---|---|---|---|
| CN | 101859801 A | * | 10/2010 |
| WO | WO 2011153671 A1 | * | 12/2011 |
| WO | WO 2011153673 A1 | * | 12/2011 |

OTHER PUBLICATIONS

Machine Generated English Translation of abstract of CN 101857953A published Oct. 2010.*

* cited by examiner

*Primary Examiner* — Sylvia R. MacArthur
(74) *Attorney, Agent, or Firm* — Anova Law Group, PLLC

(57) ABSTRACT

A clamping unit for depositing a thin film solar cell and a signal feed-in method are provided. The clamping unit comprises an electrode plate module, a signal feed-in module (201), and a supporting frame. The electrode plate module is set with a shielding cover (204). The signal feed-in module (201) comprises a waist section and a head section, wherein the head section is a rectangular-shaped signal feed-in surface. The head section of the signal feed-in module (201) is surface contacted with and is connected to the feed-in port of the electrode plate module. The feed-in port is set on the concave rectangular surface which is arranged in the central region of the back side of the cathode plate of the electrode plate module. The clamping unit can effectively remove standing wave effect and skin effect, improve the yields and reduce the costs.

10 Claims, 4 Drawing Sheets

CLAMPING UNIT FOR DEPOSITING THIN FILM SOLAR CELL AND SIGNAL FEED-IN METHOD

FIELD OF THE INVENTION

The present invention generally relates to solar cell technologies and, more particularly, to a clamping unit for depositing silicon thin film solar cells.

BACKGROUND

Currently, silicon thin film solar cells often use plasma enhanced chemical vapor deposition (PECVD) to construct single-junction or multi junction photovoltaic PIN film layers. This type of radio-frequency (RF) capacitively-coupled parallel plate reactor is commonly used in the thin film solar cell industry. Industry-wide, the electrode with a supporting frame is usually called a clamping unit, a holder, or a fixture, and the plasma chemical vapor deposition apparatus with installed holder(s) inside the chamber is often called the "deposition box," i.e., the reactor chamber.

The holders have been widely used for making large-area thin film deposition of various materials, such as amorphous silicon, amorphous silicon-germanium, silicon carbide, silicon nitride and silicon oxide, etc. The silicon thin film solar cell sector is an important branch of the solar industry, and the holder becomes one of the core equipment of the solar industry. Holders for 13.56 MHz RF are widely used in high-speed amorphous silicon thin film deposition and have high efficiency and low process cost. With the rising demand for silicon thin film technology, more attention has been given to microcrystalline and nanocrystalline silicon thin film materials.

However, in a microcrystalline environment, plasma generated by 13.56 MHz RF may have low plasma concentration, low deposition rate, long deposition period to reach targeted film thickness, and significant background pollution. Thus, the prepared thin film often has high impurity and poor optical properties, which seriously affects the quality and performance of the products. How to make high-speed deposition becomes key for crystalline silicon thin-film technology to successfully serve the industry.

Very high frequency (VHF) is referred to the legitimate frequency which is twice or more of 13.56 MHz. In the industry, the VHF mostly used is generally in the range of 27.12~100 MHz. However, in the capacitive discharge model, standing wave effect and skin effect caused by VHF become very obvious, and these effects become stronger when the driving frequency increases. Professor M. A. Lieberman of University of California, Berkeley made a thorough investigation on these two effects. His research results show that the critical condition for VHF PECVD deposition of uniform thin films is that the free space wavelength of excitation frequency ($\lambda_0$) is much larger than the capacitive discharge electrode chamber size factor (X), and the skin depth ($\delta$) is much larger than the thickness tolerance factor ($\eta_0$). For example, on 1 m$^2$ of discharging area and with an excitation frequency of 60 MHz, $\lambda_0 \approx X$ and $\delta \approx \eta$. Therefore, under this excitation frequency, the skin effect and the standing wave effect become very obvious, leading to an uneven discharge on the electrode plate of 1 m$^2$. Thus, how to achieve a large area of uniform discharge driven by VHF is one of the technical problems to be resolved for the crystalline silicon thin-film technology.

This also caused great interest in the industry. In 2003, U.S. Patent 2003/0150562A1 disclosed a method using a magnetic mirror in the capacitively-coupled discharge to improve the inhomogeneity caused by VHF. Chinese patents 200710150227.4, 200710150228.9, and 200710150229.3 disclosed three electrode designs of VHF, applying different feed-in forms of VHF signals to obtain uniform electric fields.

However, the following problems may still remain: 1) The electrodes in the VHF-PECVD chamber have complex design structures; 2) One reason for the continuous improvement is that the constant assembly/disassembly and cleaning of the reaction chamber and electrodes can cause abnormal deformation of the electrodes; 3) The multi-point feed-in structures disclosed in the existing patents may have a small contact surface, which requires symmetrical paths of individual feed-in points and there is no contact between the bonding conductors at the feed-in points and the cathode plate. More specifically, a shield of isolation may be needed between the bonding conductor and the cathode plate for effective discharge. These structural designs have relatively harsh actual requirements, have too many determination factors for uniform discharge, and cannot meet the actual production needs such as disassembly and cleaning.

Therefore, for the equipment used by the industry, a single point feed-in becomes the mainstream design. But due to the standing wave effect and the skin effect, current single-point feed-in structures cannot meet the requirement for increasing the high feed-in frequency. Thus, further development and improvement may be needed to make the existing deposition holders more practical to meet the current market demand and to reduce the cost. Meanwhile, it is also a trend to use CVD holder system capable of processing or depositing multiple glasses. Therefore, it is of great practical significance for the industry to apply an effective VHF feed-in model to meet the demand of mass production and to enter the industrial production stage.

CONTENTS OF THE INVENTION

On the basis of the above analysis of the current technical difficulties for silicon crystalline thin films, the present invention intends to solve the problems such as the non-uniformity and inconsistency of VHF-driven high-speed deposition thin film. Accordingly, the technical solutions include: an electrode plate component, a signal feed-in component, and a supporting frame. The electrode plate component with a shielding cover is arranged in the supporting frame to form a holder array for discharging electricity, and one end of the signal feed-in component makes surface contact and connects with a feed-in port of the electrode plate component to feed-in RF/VHF power supply signals. Further, the feed-in port is located on a surface of a hollowed rectangular area at the center of the backside of a cathode plate of the electrode plate component with the shielding cover. The signal feed-in component is a strip and stair-shaped signal feed-in strip, including a waist and a head with a rectangular-shaped signal feed-in surface. The signal feed-in strip is an RF copper conductor strip, the waist being covered by a shielding layer containing a ceramic insulation layer The technical solutions also include: the shielding cover of the electrode plate component covers entire back and side surface of the cathode plate, and certain space is arranged or a layer of insulation material is filled between the cathode plate of the electrode plate component and the shielding cover (which may have a metal shell). The shielding cover of the cathode plate has a through hole corresponding to the feed-in port of the cathode plate to prevent the signal feed-in component from contacting the shielding cover when coming out the through hole.

The supporting frame according to the technical solutions includes a top fixed plate, a bottom fixed plate, and side frames. The anode plate includes a ground, guide slots, and substrate assembly/disassembly components, and the cathode plate is insulated from the guide slots.

The technical solutions according to the present invention also include a method for a signal feed-in mode of a deposition holder driven by legitimate 27.12 MHz~200 MHz VHF, including arranging the electrode plate component with a shielding cover in the supporting frame to form a holder array for discharging electricity, the signal feed-in component including a strip and stair-shaped signal feed-in strip with one end making surface contact and connecting with a feed-in port; feeding-in RF/VHF power supply signals to the rectangular feed-in port that is located on a surface of a hollowed rectangular area at the center of the backside of a cathode plate of the electrode plate component with the shielding cover; discharging inside the supporting frame to form the electrode plate component array with certain discharging space. The holder array includes the electrode plate component array. The signal feed-in component has a waist with an insulation shielding cover and a head with a rectangular-shaped feed-in surface corresponding to the feed-in port located on a rectangular surface of a hollowed rectangular area.

The signal feed-in method also includes that the shielding cover of the cathode plate has a through hole corresponding to the feed-in port of the cathode plate to prevent the signal feed-in component from contacting the shielding cover when coming out the through hole.

Advantages of disclosed embodiments of the present invention include, unlike the slot-based cathode plate with side feed-in mode, a larger discharge area, higher uniformity and more stable discharge, smaller access capacitance, less RF interference between holders, and weaker standing wave and skin effects. The present invention may be applied in large area uniform discharge with any legitimate VHF in the range of 27.12 MHz~200 MHz to increase productivity and to reduce solar cell cost.

BRIEF DESCRIPTION OF THE DRAWINGS

In FIG. 1-7, the holder 02 includes an electrode plate component, a signal feed-in component, and a supporting frame. The electrode plate component includes anode plates 208, cathode plates 203, and insulation layer 207 placed between a cathode plate 203 and cathode shielding cover 204. The signal feed-in component includes a waist and a head with rectangular-shaped signal feed-in surface 201-1. The waist is a flat strip covered with a ceramic insulation cover 202. The rectangular feed-in surface 201-1 makes surface contact with the feed-in port 203-1 located at a hollowed rectangular area at the center of the backside of the cathode electrode plate, and feeds-in RF/VHF power supply signals.

Figure 1:
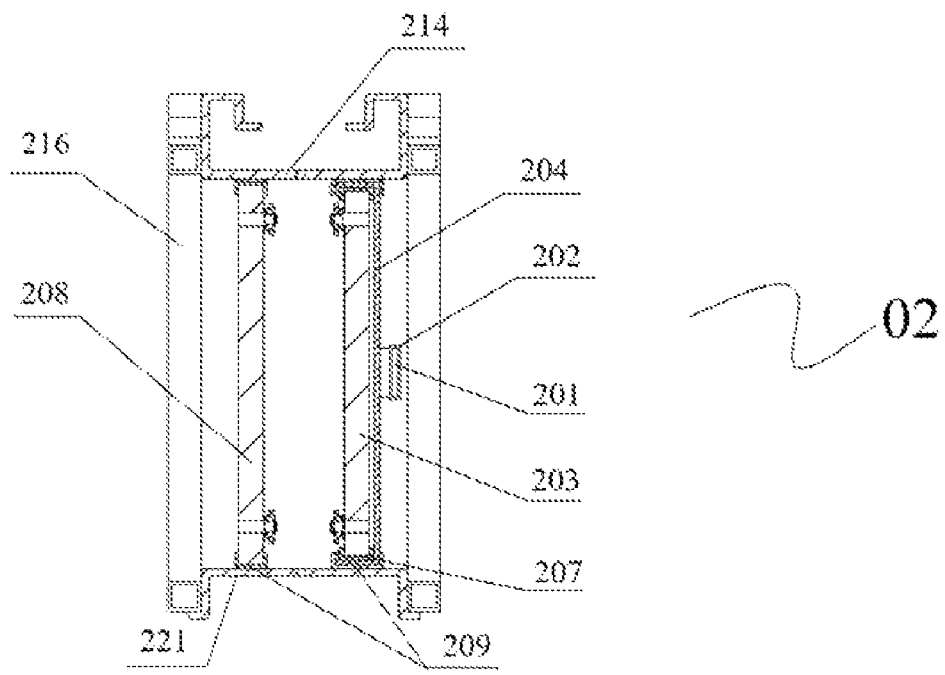
FIG. 1 is a cross-section pictorial view of the holder according to the present invention.
Figure 2:
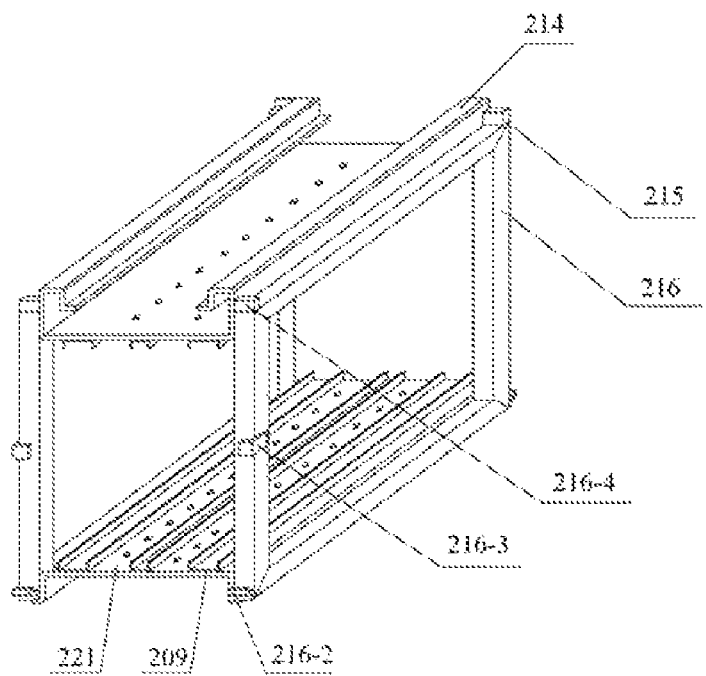
FIG. 2 is a structural diagram of a supporting frame.
Figure 3:
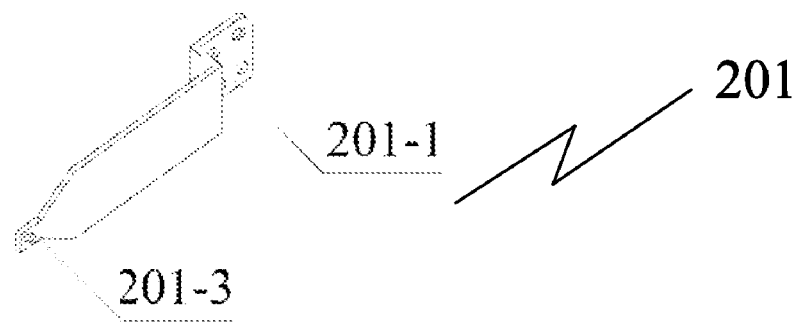
FIG. 3 is a structural diagram of signal feed-in component 201 (referred as feed-in component or feed-in strip).
Figure 4:
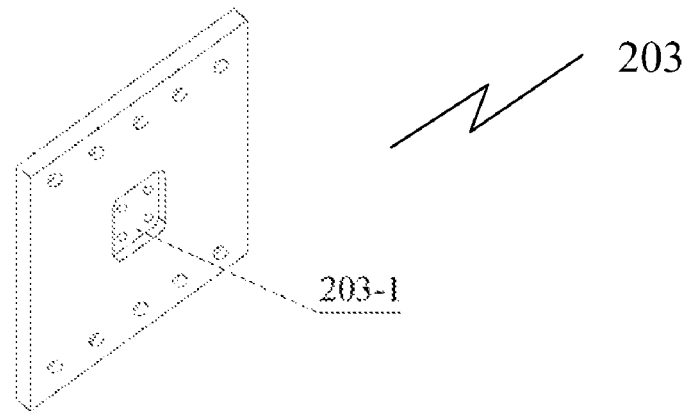
FIG. 4 is a structural diagram of cathode plate 203.
Figure 5:
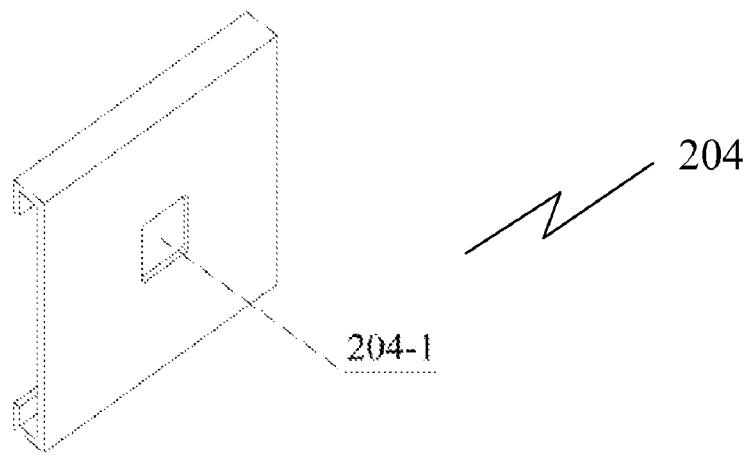
FIG. 5 is a structural diagram of cathode shielding cover 204.
Figure 6:
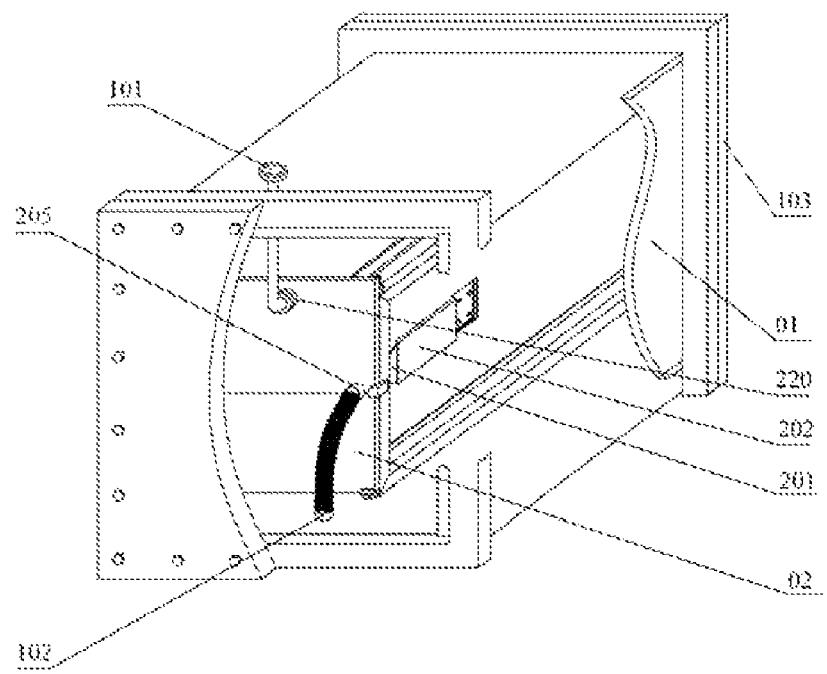
FIG. 6 is a structural diagram of the first embodiment of the present invention.

The supporting frame consists of a top fixed plate 214, a bottom fixed plate 221, and side frames 216, and grounded metal guide slots 209 are arranged on both the top fixed plate 214 and the bottom fixed plate 221. Holder 02 discharges in the vacuum chamber 01, depositing P-I-N film on the substrate 206. The vacuum chamber 01 contains gas system access port 101, power system access port 102, and vacuum system access port 105.

According to the present invention, the design of a surface feed-in holder achieves the purposes of the present invention mentioned above, which overcomes many difficult-to-solve problems of the existing multi-point feed-in VHF-PEVCD deposition techniques for crystalline silicon-based thin films, such as the complex electrode structures of the reaction chamber, easy electrode deformation, small contact area, and requiring symmetrical paths among individual feed-in points and complete shielding, etc. These problems do not exist in surface feed-in holder design according to the present invention, and large area of uniform electric fields can be obtained to discharge electricity inside the chamber. Further, CVD holder systems capable of processing or depositing multiple glass plates are used, with effective VHF surface feed-in models, to achieve operational industrial production processes and to meet the needs of mass production of the silicon-based thin film solar cells.

The contributions of the present invention also include providing fundamental solutions to the uniformity and consistency of VHF power-driven high-speed deposition film. Holder 02 includes an electrode plate component, a signal feed-in component, and a supporting frame. The supporting frame includes a top fixed plate 214, a bottom fixed plate 221, side frames 216, and grounded metal guide slots 209 are arranged on both the top fixed plate 214 and the bottom fixed plate 221.

The electrode plate component includes anode plate 208 and cathode plate 203, and the insulation layer or strip 207 is placed between cathode plate 203 and cathode shielding cover 204. The cathode shielding cover 204 and anode plate 208 are connected to ground. The feed-in port 203-1 of RF/VHF power supply signal is located at the center of the backside of the cathode electrode plate 203 and inside a hollowed rectangular area. The signal feed-in component 201 includes a waist section with a ceramic insulation layer 202 and a head section with a rectangular feed-in surface 201-1. The waist section is flat for easy installation and less signal feed-in loss. The head section rectangular feed-in surface 201-1 makes surface contact and connects with the feed-in port 203-1 located on a rectangular surface of a hollowed rectangular area at the center of the backside of the cathode electrode plate. The other end 201-3 of the signal feed-in component 201 connects to the negative port of the RF/VHF power supply and power matching device (not shown). The signal feed-in component 201 is of a stair or step shape and one rectangular end makes surface contact and connects with the feed-in port of the electrode plate component in the holder with grounded device, both of them having insulation and shielding protective devices (not shown).

DETAILED DESCRIPTION OF THE EMBODIMENTS

The First Embodiment

The electrode plates are arranged vertically, and the feed-in port of cathode is of a rectangular shape and is located on a rectangular surface of a hollowed rectangular area at the center of the backside of the cathode electrode plate of the electrode plate component with a shielding cover. The signal feed-in component includes a flat waist and a head with a rectangular-shaped signal feed-in surface.

The followings illustrate this embodiment of the present invention in detail together with accompanying FIGS. 1-6.

According to the present invention, the deposition holder of thin-film solar cells uses a VHF power supply with a working frequency of approximately 27.12-100 MHz. The vacuum chamber 01 is used to achieve a vacuum state, and the gas system access port 101 is configured on the top of vacuum chamber 01. The vacuum chamber 01 also includes power system access port 102, vacuum system access port 105, and a moveable vacuum door 103 is installed at the front of the vacuum chamber 01. Holder 02 discharges (electricity) in the vacuum environment to form a large-area uniform electric field inside the chamber, and the substrates 206 in the chamber are deposited with heterojunction P-I-N laminated film to form thin-film solar cell plates or so-called chips, which are suitable for mass production.

The entrance of the fixed gas pipe on holder 02 is coupled with the nozzle of the gas system port 101 inside the vacuum chamber 01. One end of the power cord is connected with the power connector of holder 02, and the other end of the power cord is connected with the access port 102 of VHF power system. The insulation layer or strip 207 is placed between cathode plate 203 and cathode shielding cover 204, and the rectangular feed-in surface 201-1 of the head of signal feed-in component 201 is in surface contact with the feed-in port 203-1 on the backside of cathode plate 203 to feed-in RF/VHF power supply signals. The through hole 201-3 at the other end of the feed-in strip is connected with the power connector 205. The waist of the signal feed-in component 201 is covered by a ceramic insulation layer 202 to prevent the feed-in component 201 from contacting the cathode shielding cover 204.

The cathode shielding cover 204 has a through hole 204-1 corresponding to the location of the feed-in port 203-1 of cathode plate 203 such that the signal feed-in component 201 can come out of the cathode plate 203 without contacting the cathode shielding cover 204. The feed-in strip 201 may be made of metal copper with desired conductivity, and both the cathode shielding cover 204 and the anode plates 208 are grounded. The pre-coated substrates 206 are placed in the chamber of the holder 02, and the holder 02 is placed into the vacuum chamber 01.

The moveable door 103 of the vacuum chamber 01 is then closed, and a desired vacuum state can be reached through the vacuum system. Further, argon gas is filled in the chamber. When the pressure in the chamber reaches approximately 60 Pa, the VHF power supply is turned on to discharge electricity to clean the chamber, and the power is turned off thereafter. Further, a high-degree of vacuum of approximately $5.0 \times 10^{-4}$ Pa is reached, and argon gas is filled in to clean the chamber. Finally, the process gas is fed in the chamber at approximately 5 slpm to start the deposition process and to complete vapor deposition film.

The Second Embodiment

The feed-in port of cathode is of a rectangular shape and is located on a rectangular surface of a hollowed rectangular area at the center of the backside of the cathode electrode plate of the electrode plate component with a shielding cover. The signal feed-in component includes a flat waist and a head with a rectangular-shaped signal feed-in surface.

Figure 7:
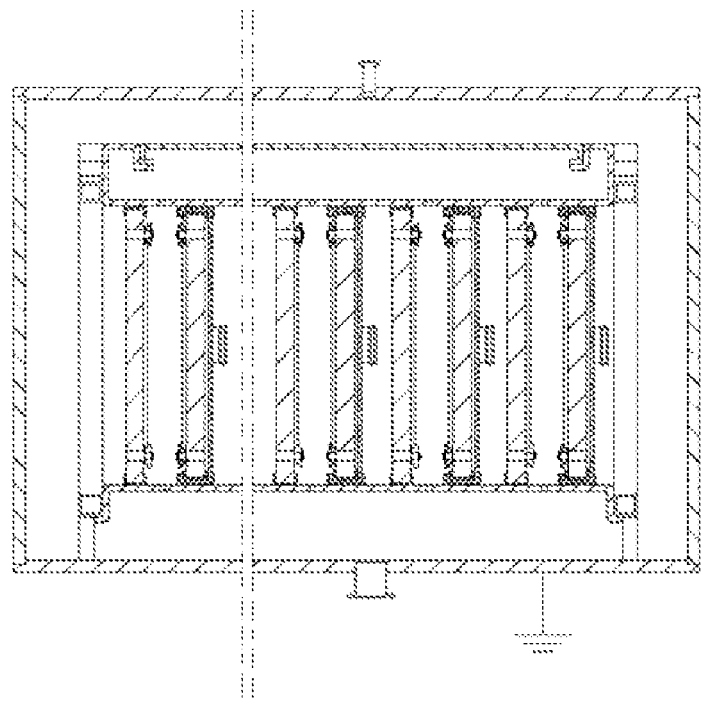
FIG. 7 is a structural diagram of the second embodiment of the present invention.

The holder in FIG. 7 is similar to that in the first embodiment. In this embodiment, a vertical deposition chamber is used. Twelve (12) anode plates 208 and twelve (12) cathode plates 203 form 12 sets of electrodes, and a total 24 substrates 206 can be deposited with thin film simultaneously. The detailed procedure is described as follows:

a) Placing 24 glass substrates 206 (1640 mm×707 mm×3 mm) each coated with a transparent conductive film of approximately 600 nm thickness in the corresponding 24 substrate locations on the holder 02, with the film side facing outside and the glass side facing the electrode.

b) Opening the movable door 103, placing the holder 02 in the vacuum chamber 01, and closing the movable door 103 of the vacuum chamber 01.

c) Reaching a vacuum state of approximately $5.0 \times 10^{-4}$ Pa inside the vacuum chamber and filling in argon gas. When the pressure inside the chamber reaches approximately 60 Pa, turning on the 40.68 MHz VHF power supply, discharging at 400 W to clean the chamber for 2 minutes, and turning off the power supply.

d) Reaching a high-degree vacuum state of approximately $5.0 \times 10^{-4}$ Pa and cleaning the chamber twice with argon gas.

e) Pumping in a gas mixture (silane and hydrogen) at 5 slpm into the chamber and, when the pressure inside the chamber reaches approximately 60 Pa, turning on the 40.68 MHz VHF power supply. Afterward, discharging at 400 W and depositing microcrystalline silicon intrinsic layer for 40 minutes.

f) Turning off the power supply and reaching a high-degree vacuum state.

g) Filling the chamber with nitrogen gas to atmosphere pressure, opening the vacuum chamber movable door 103, taking out the holder 02, and cooling the TCO glasses at room temperature.

The Third Embodiment

The feed-in port of cathode is of a rectangular shape and is located on a rectangular surface of a hollowed rectangular area at the center of the backside of the cathode electrode plate of the electrode plate component with a shielding cover. The signal feed-in component includes a flat waist and a head with a rectangular-shaped signal feed-in surface.

Figure 8:
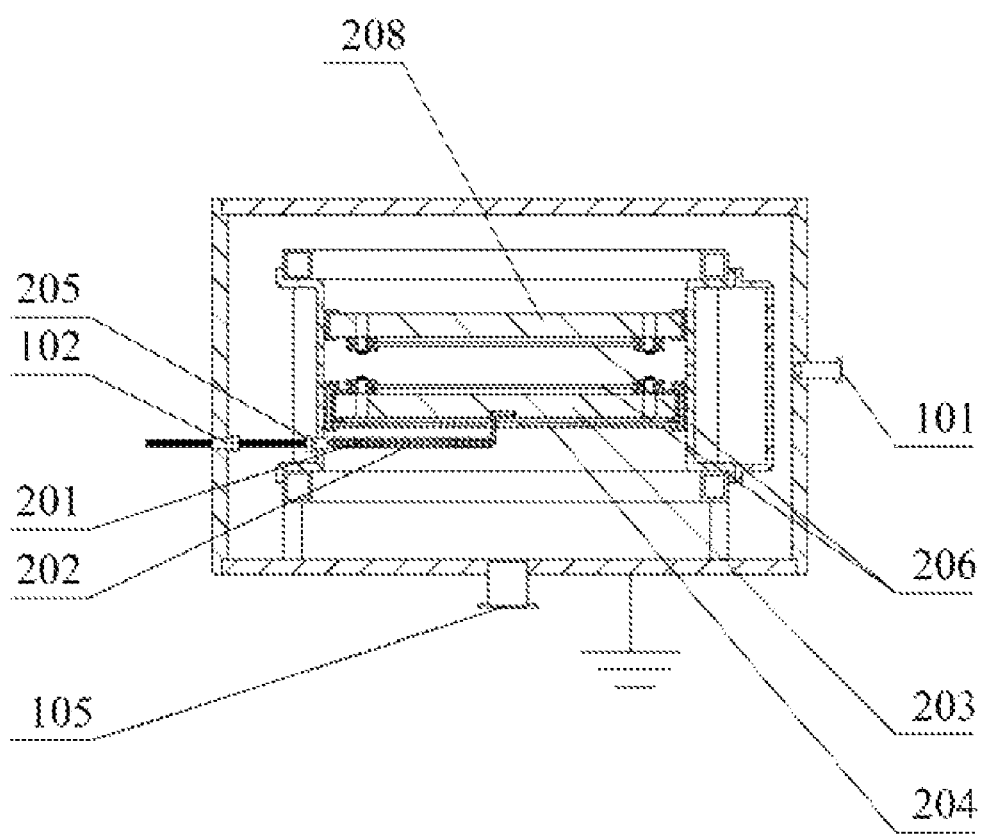
FIG. 8 is a structural diagram of the third embodiment of the present invention.

The holder in FIG. 8 is similar to that in the first embodiment. In this embodiment, a horizontal deposition chamber is used. An anode plate 208 and a cathode plate 203 form a set of electrodes, and a total of 2 substrates 206 can be deposited with thin film simultaneously.

a) Placing 2 glass substrates 206 (1640 mm×707 mm×3 mm) each coated with a transparent conductive film of approximately 600 nm thickness in the corresponding 2 substrate locations on the holder 02, with the film side facing outside and the glass side facing the electrode plates.

b) Opening the vacuum chamber movable door 103, placing the holder 02 in the vacuum chamber 01, and closing the movable door 103 of the vacuum chamber 01.

c) Reaching a vacuum state of approximately $5.0 \times 10^{-4}$ Pa inside the vacuum chamber and filling in argon gas. When the pressure inside the chamber reaches approximately 60 Pa, turning on the 40.68 MHz VHF power supply, discharging at 400 W to clean the chamber for 2 minutes, and turning off the power supply.

d) Reaching a high-degree vacuum state of approximately $5.0 \times 10^{-4}$ Pa and cleaning the chamber twice with argon gas.

e) Pumping in a gas mixture (silane and hydrogen) at 5 slpm into the chamber and, when the pressure inside the chamber reaches approximately 60 Pa, turning on the 40.68

MHz VHF power supply. Further, discharging at 400 W and depositing microcrystalline silicon intrinsic layer for 40 minutes.

f) Turning off the power supply and reaching a high-degree vacuum state.

g) Filling the chamber with nitrogen gas to atmosphere pressure, opening the vacuum chamber movable door, taking out the holder 02, and cooling the TCO glasses at room temperature.

The above detailed explanations illustrate embodiments of the present invention together with accompanying figures. However, the present invention is not limited by the embodiments, especially with respect to the shapes of the feed-in components and cathode plates. Those of ordinary skill in the art can make various changes without departing from the principles and purposes of the present invention.

What is claimed is:

1. A deposition holder for silicon thin-film solar cells, comprising:
   an electrode plate component;
   a signal feed-in component; and
   a supporting frame, wherein:
   the electrode plate component with a shielding cover is arranged in the supporting frame to form a holder array for discharging electricity;
   one end of the signal feed-in component makes surface contact and connects with a feed-in port of the electrode plate component to feed-in RF/VHF power supply signals;
   the feed-in port is located on a surface of a hollowed rectangular area at the center of the backside of a cathode plate of the electrode plate component with the shielding cover; and
   the signal feed-in component is a strip and stair-shaped signal feed-in strip, including a waist and a head with a rectangular-shaped signal feed-in surface.

2. The deposition holder for silicon thin-film solar cells according to claim 1, wherein:
   the signal feed-in component is a feed-in strip having a waist with an insulation shielding cover, and one end of the signal feed-in component is a rectangular-shaped feed-in surface.

3. The deposition holder for silicon thin-film solar cells according to claim 2, wherein:
   the signal feed-in strip is an RF copper conductor strip, the waist being covered by a shielding layer containing a ceramic insulation layer.

4. The deposition holder for silicon thin-film solar cells according to claim 1, wherein:
   the signal feed-in strip is an RF copper conductor strip, the waist being covered by a shielding layer containing a ceramic insulation layer.

5. The deposition holder for silicon thin-film solar cells according to claim 1, wherein:
   the feed-in port is located on the surface of the hollowed rectangular area at the center of the backside of the cathode plate which is completely shielded; and
   certain space is arranged or a layer of insulation material is filled between the cathode plate and the shielding cover.

6. The deposition holder for silicon thin-film solar cells according to claim 1, wherein:
   the shielding cover of the electrode plate component covers entire back and side surface of the cathode plate; and
   certain space is arranged or a layer of insulation material is filled between the cathode plate of the electrode plate component and the shielding cover.

7. The deposition holder for silicon thin-film solar cells according to claim 1, wherein:
   the shielding cover of the cathode plate has a through hole corresponding to the feed-in port of the cathode plate to prevent the signal feed-in component from contacting the shielding cover when coming out the through hole.

8. The deposition holder for silicon thin-film solar cells according to claim 7, wherein:
   the shielding cover has a metal shell and a ceramic insulation layer is arranged between the shielding cover and the back of the cathode plate.

9. The deposition holder for silicon thin-film solar cells according to claim 1, wherein:
   an anode plate includes a ground, guide slots, and substrate assembly/disassembly components.

10. The deposition holder for silicon thin-film solar cells according to claim 1, wherein:
    the supporting frame includes a top fixed plate, a bottom fixed plate, and side frames.

* * * * *